United States Patent
Xu et al.

(10) Patent No.: US 8,803,627 B1
(45) Date of Patent: Aug. 12, 2014

(54) WIDEBAND DIRECT DCO MODULATOR WITH IN-BAND COMPENSATION

(71) Applicant: Innophase Inc., Chicago, IL (US)

(72) Inventors: Yang Xu, Chicago, IL (US); Sara Munoz Hermoso, Chicago, IL (US); Xi Li, Allen, TX (US)

(73) Assignee: Innophase Inc., Chicago, IL (US)

( * ) Notice: Subject to any disclaimer, the term of this patent is extended or adjusted under 35 U.S.C. 154(b) by 0 days.

(21) Appl. No.: 14/095,968

(22) Filed: Dec. 3, 2013

(51) Int. Cl.
*H03C 3/00* (2006.01)

(52) U.S. Cl.
USPC ............... 332/144; 332/145; 331/16; 331/17

(58) Field of Classification Search
USPC ............... 331/16, 17; 375/376; 332/144, 145
See application file for complete search history.

(56) References Cited

U.S. PATENT DOCUMENTS

| | | | |
|---|---|---|---|
| 5,966,055 A | 10/1999 | Knoedl, Jr. et al. | |
| 6,693,956 B1 * | 2/2004 | Yamamoto | 375/219 |
| 6,693,969 B1 | 2/2004 | Montalvo et al. | |
| 6,975,686 B1 | 12/2005 | Khatibzadeh et al. | |
| 7,012,470 B2 * | 3/2006 | Suzuki et al. | 331/16 |
| 7,230,505 B2 | 6/2007 | Rachedine et al. | |
| 7,453,325 B2 | 11/2008 | Hammes et al. | |
| 7,728,690 B2 | 6/2010 | Ballantyne | |
| 8,442,466 B2 | 5/2013 | Trikha et al. | |
| 8,554,159 B2 | 10/2013 | van Waasen et al. | |
| 2007/0036238 A1 * | 2/2007 | Matero et al. | 375/296 |
| 2008/0310573 A1 * | 12/2008 | Lewis et al. | 375/376 |
| 2009/0245418 A1 * | 10/2009 | Yamaji | 375/297 |
| 2011/0163822 A1 * | 7/2011 | Yamanouchi et al. | 332/145 |
| 2012/0201338 A1 * | 8/2012 | Leung et al. | 375/376 |

* cited by examiner

*Primary Examiner* — Joseph Chang
*Assistant Examiner* — Jeffrey Shin
(74) *Attorney, Agent, or Firm* — Invention Mine LLC

(57) ABSTRACT

A Direct VCO (DCO) modulation apparatus and method that provides a wideband modulated signal output. The wideband response is obtained via signal processing to counteract a high-pass frequency characteristic as seen from the VCO modulation input. That is, low frequency components of data signals are compensated before being applied to a VCO input. The high-pass characteristic in combination with the compensated signal provides a relatively flat, wideband frequency response of the DCO modulator.

30 Claims, 7 Drawing Sheets

WIDEBAND DIRECT DCO MODULATOR WITH IN-BAND COMPENSATION

BACKGROUND OF THE INVENTION

The tuning input of a voltage controlled oscillator (VCO) has been used to generate a modulated transmit signal. However, when the VCO is included in a phase locked loop (PLL) configuration, the response of the PLL acts as a high pass filter, effectively removing low frequency components of the modulation signal. To eliminate this effect, single point modulation schemes were developed that inject the modulating signal by either adjusting the reference oscillator used by the phase comparator or by adjusting a frequency divider ratio in the feedback loop. One limitation of such systems is that the bandwidth of the modulation is inherently limited by the bandwidth of the PLL feedback loop. Even with the addition of high-pass compensation schemes, the bandwidth available is limited to a few megahertz.

FIG. 1 is a prior art system 100 for providing a phase-modulated signal 102 processed by a differentiator 104 that is then applied to a Digital VCO (DCO) 106. The output of the DCO is applied to a loop filter 108 and combined at the input to the DCO 106. The output 110 is applied to an amplifier 112 to generate an amplified transmit signal 114.

FIG. 2A is a signal plot showing the frequency of an original phase modulated signal and the frequency of the signal after high-pass filtering. Although the frequency signals 202, 204 appear very close, the plots of FIG. 2B show that the phase 210 of the output signal differs significantly from the input phase 206. Initially, in the example waveform of FIG. 2B, the input phase 206 is greater than the output phase 210 until the waveforms cross approximately at point 208.

To compensate for the limitations of the single-point modulation, so-called "two-point" modulation schemes were developed to increase the available bandwidth that may be generated by the PLL/VCO modulator. As shown in FIG. 4, two-point systems typically operate by splitting the information signal into high-pass 402 and low-pass 404 components, where the high-pass component is used to direct-modulate the VCO, while the low pass component is used within the PLL loop to either adjust the reference oscillator or to adjust a frequency divider ratio in the feedback loop. Modulation at these two points produces a composite signal 406 with a spectral response (as shown by the Power Spectral Density, or PSD) extending down to DC as shown in 408.

Some inherent challenges exist with two-point modulation, including synchronization of the high-pass and low-pass modulation components, as well as high power consumption resulting from high-rate PLL operations.

Accordingly, there is a need for improved wideband phase direct VCO (DCO) modulators.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
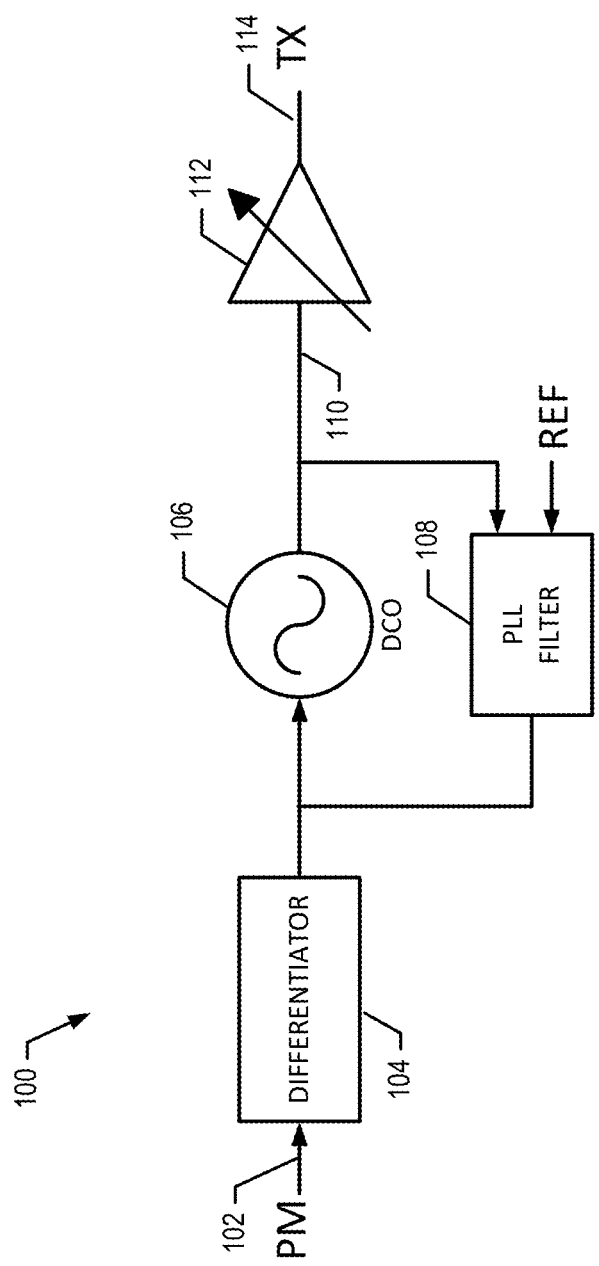
FIG. 1 is a block diagram of a prior art single point modulator.
Figure 2A:
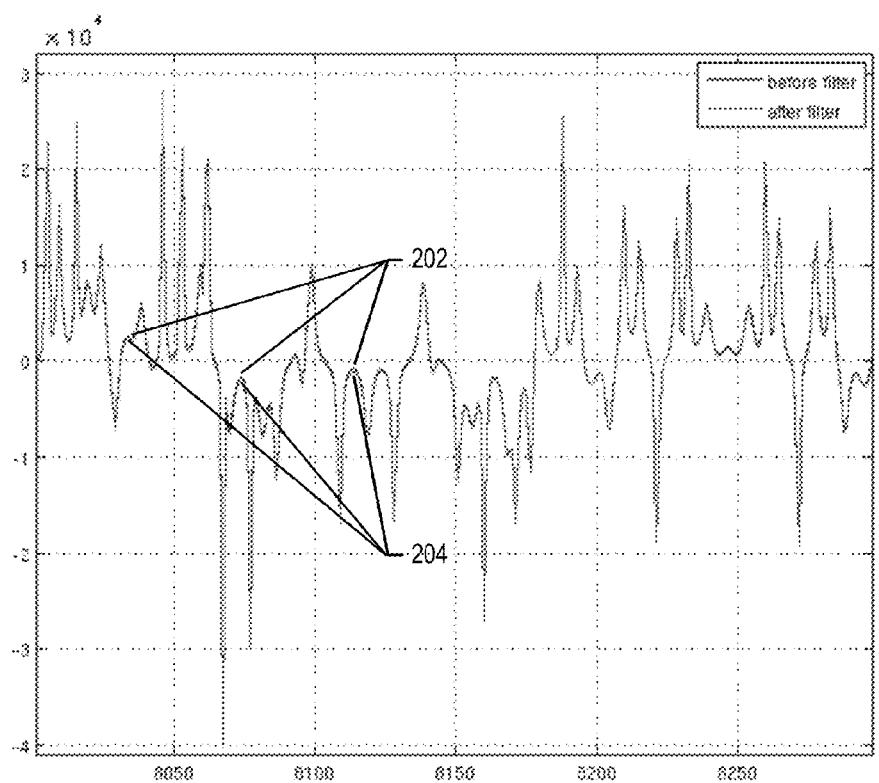
FIGS. 2A-2B are plots of prior art frequency and phase signals.
Figure 2B:
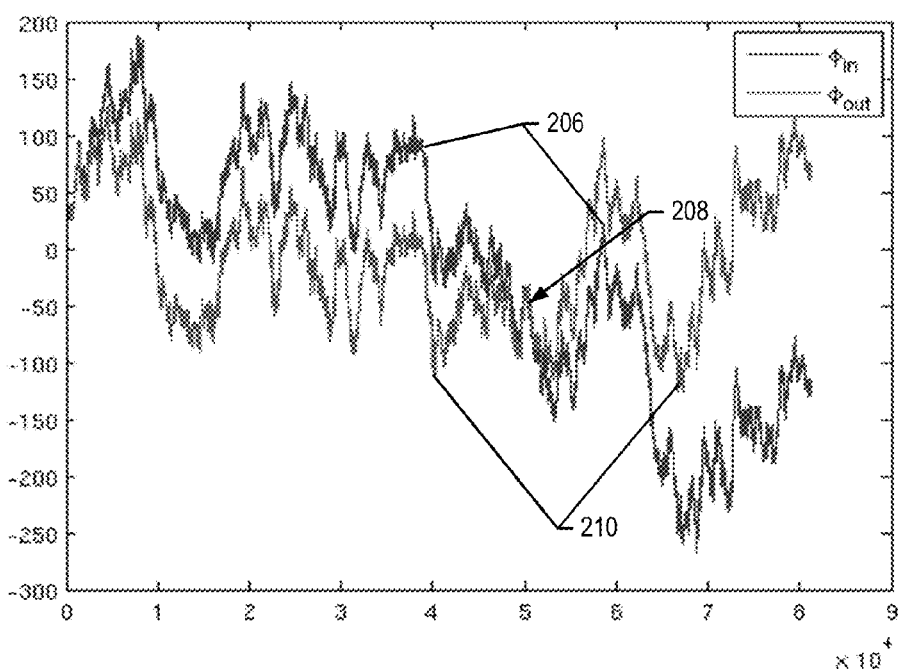
Figure 3:
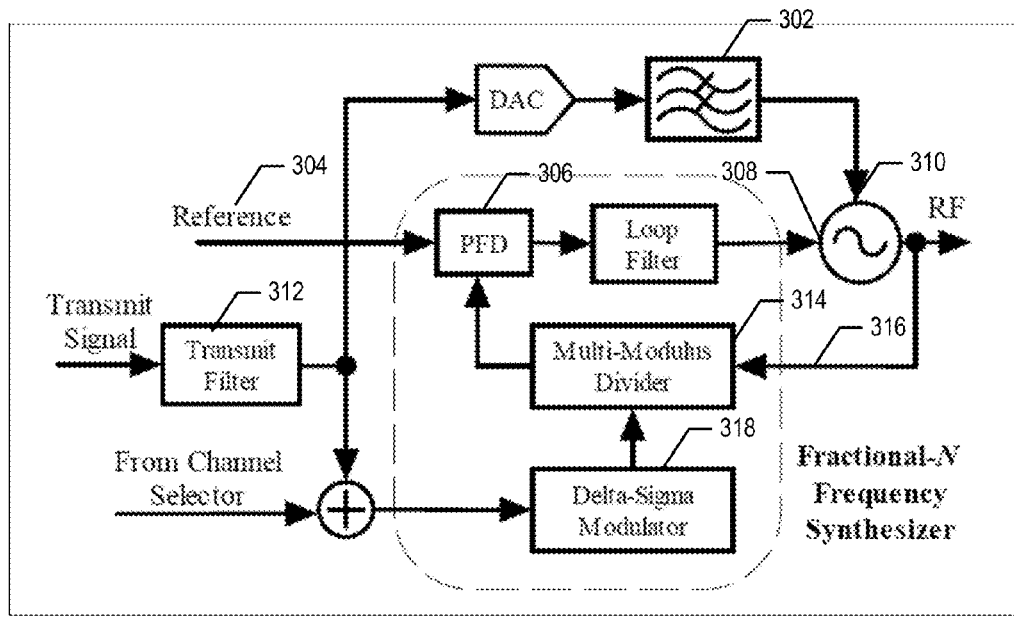
FIGS. 3 and 4 are prior art two-point modulation systems.
Figure 4:
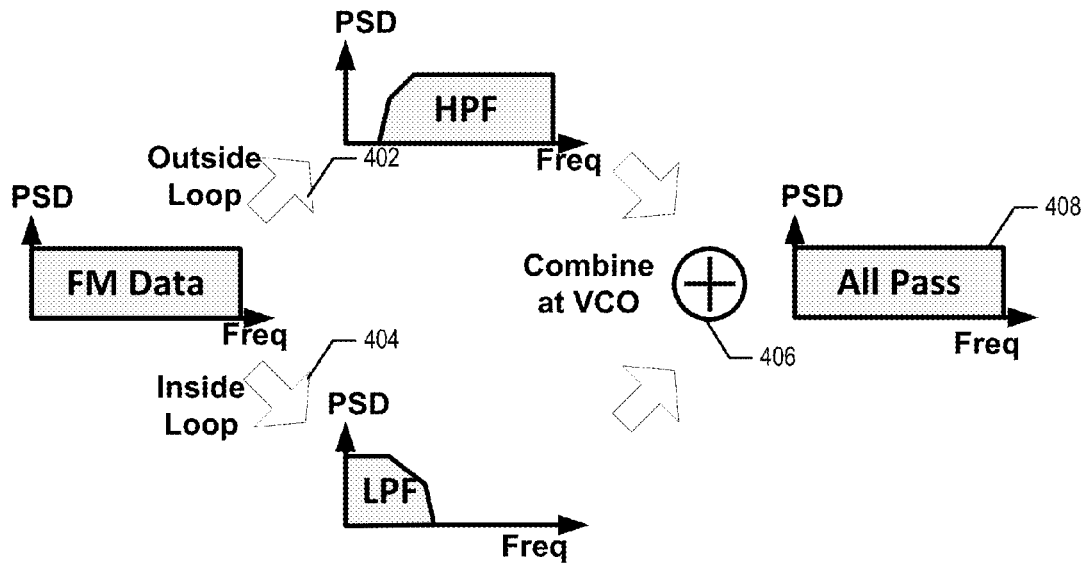

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Described herein is a Direct VCO (DCO) modulation apparatus and method that provides a wideband modulated signal output. The wideband response is obtained via signal processing to counteract a high-pass frequency characteristic of the phase locked loop (PLL) as seen from the VCO modulation input. That is, low frequency components of data signals are compensated before being applied to a VCO input. The high-pass characteristic in combination with the compensated signal provides a relatively flat, wideband frequency response of the direct VCO (DCO) modulator.

In some embodiments, an apparatus comprises a phase locked loop having a VCO-output high-pass characteristic, and the PLL includes a voltage controlled oscillator (VCO) having a PLL VCO control input and a modulation VCO control input. The embodiment also includes a phase locked loop controller coupled to the PLL VCO control input and configured to output a PLL control signal to the PLL VCO control input; a signal phase generator configured to generate a phase signal of a desired information-modulated transmit signal; a compensation filter configured to generate a compensated phase signal by increasing low-frequency components of the phase signal to compensate for the VCO-output high-pass characteristic and the VCO gain characteristic; a phase derivative generator having an input coupled to the compensation filter, the phase derivative generator configured to receive the compensated phase signal and to convert the compensated phase signal to a compensated phase derivative modulation signal, and having a modulation control output coupled to the modulation VCO control input for providing the compensated phase derivative modulation signal to the VCO.

In further embodiment, a method comprises: generating a phase signal of a desired information-modulated transmit signal; compensation filtering the phase signal to generate a compensated phase signal by increasing low-frequency components of the phase signal to compensate for a VCO-output high-pass characteristic; generating a compensated phase derivative modulation signal by converting the compensated phase signal to a compensated phase derivative modulation signal; providing the compensated phase derivative modulation signal to a modulation input of a VCO; generating a PLL VCO control signal using a low pass loop filter operating on a PLL error signal formed using an output of the VCO; applying the PLL VCO control signal to a PLL VCO control input, wherein the PLL VCO control signal operates to provide the VCO-output high-pass characteristic by removing low-frequency variations from an output of the VCO, and wherein the compensated phase derivative modulation signal counteracts the VCO-output high pass characteristic; and, providing the output of the VCO to a signal amplifier.

Figure 5:
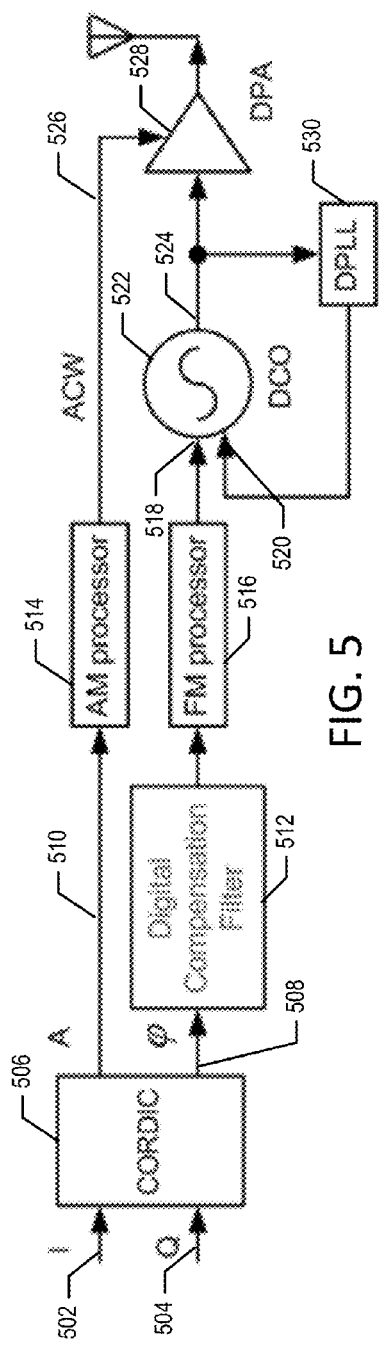
FIG. 5 is a direct VCO modulation system using a digital compensation filter in accordance with some embodiments.

With respect to FIG. 5, one embodiment of a DCO modulator is depicted. Baseband inphase (I) signals and quadrature (Q) signals are applied at inputs 502, 504 to a signal phase generator 506. The signal phase generator may therefore be configured to process an inphase baseband signal and a quadrature baseband signal and perform a rectangular-to-polar conversion. In some embodiments, the signal phase generator is a CORDIC (COordiante Rotation Digital Computer) calculator.

The signal phase generator produces a phase signal on output 508, which is applied to compensation filter 512. The compensation filter 512 is configured to generate a compensated phase signal by increasing low-frequency components of the phase signal to compensate for the VCO-output high-pass characteristic and the VCO gain characteristic. This may also be referred to as a low-frequency-peaking compensation filter. In some embodiments the compensation filter may include a factor to account for the VCO constant $k_{vco}$, which represents the sensitivity of the VCO's change in frequency with respect to the voltage input.

In some embodiments, the signal phase generator may be combined with a signal envelope generator configured to generate an envelope signal on output 510. The envelope signal corresponds to the envelope of a desired information-modulated transmit signal, such as the envelope formed by the magnitude of the baseband I/Q signals on inputs 502, 504. The envelope signal may be digital in nature and be used to control a digitally switching amplifier, or may be analog and be used to control an analog power control input of an amplifier. Further, a digital envelope signal may be converted to an analog signal and applied to an analog power control input.

The FM processor 516 includes a derivative generator, such as a digital differentiator filter, to generate a derivative of the compensated phase signal. That is, the phase derivative generator is configured to receive the compensated phase signal and to convert the compensated phase signal to a compensated phase derivative modulation signal. In some embodiments, the differentiator may be implemented by a two tap filter representing a simple difference equation, such as $y[n]=x[n]-x[n-1]$. In other embodiments, a differentiation filter with additional taps may be used.

The FM processor may also incorporate a correction factor to account for the VCO constant $k_{VCO}$. In some embodiments FM processor 516 may provide additional pre-processing to account for distortions including non-linear response characteristics of the DCO 522. That is, if the change in frequency does not track linearly with changes to the input signal, then the nonlinearity may be inverted by a mapping of the linear control signal to a pre-distorted signal that when combined with the nonlinear characteristic effectively removes the nonlinearity. The nonlinear characteristic of the VCO may be measured during a calibration procedure by varying the input control signal and measuring the output frequency. In many embodiments, any additional FM processing as described herein may be incorporated into the overall compensation filter structure and signal processing.

In further embodiments, the DCO may include a first variable capacitance that is adjustable by a channel selector to allow selection of a particular communication channel frequency. The channel selector may be incorporated into a state machine, or may otherwise be embedded within a suitable processor used to implement the transmitter's medium access control (MAC) layer. In an embodiment of the DCO modulator for use in IEEE 802.11b, for example, the channel selector may select a capacitance value corresponding to a particular channel frequency, where there are thirteen channels having a 5 MHz separation. The PLL circuit then operates to keep the VCO centered on the desired carrier frequency. In addition, in some embodiments, as the VCO is tuned across the available channels, the $k_{VCO}$ of the data modulation input may vary according the selected channel. The compensation filter or other FM processing performed by FM processor 516 may be configured to utilize the appropriate channel-specific $k_{VCO}$ characteristic (a $k_{VCO}$ constant and/or nonlinear response characteristic). In further embodiments, the $k_{VCO}$ may be determined by a calibration procedure.

In a further embodiment, the DCO modulator may use a third VCO input connected to a third variable capacitance, such as tunable varactors, to utilize a coarse tuning value from a channel selector for purposes of transmit channel selection, together with the separate first tunable capacitance connected to the PLL VCO control input for PLL-driven carrier generation control. Note that the dynamic range of capacitance variations for the PLL VCO control input may be smaller than the dynamic range of capacitance values used in conjunction with the data path associated with the modulation VCO control input, which may utilize a high dynamic range and high resolution.

Therefore, further embodiments include an apparatus comprising: an oscillator having an oscillator output, a first variable capacitance, and a second variable capacitance; a time-to-digital converter (TDC) connected to the oscillator output configured to generate a frequency error signal at an error output; a loop filter connected to the TDC and configured to low-pass filter the frequency error output signal and to generate a loop VCO error signal at a loop filter output, the loop filter output connected to the first variable capacitance to reduce low-frequency carrier deviations at the oscillator output, including data-modulation-induced low-frequency variations; a low-frequency-peaking compensation filter connected to the second variable capacitance, the low-frequency-peaking compensation filter configured to generate a compensated phase signal by increasing low-frequency components of a desired phase signal to compensate for the reduction of data-modulation-induced low-frequency carrier deviations; a phase derivative generator having an input coupled to the low-frequency peaking compensation filter, the phase derivative generator configured to receive the compensated phase signal and to convert the compensated phase signal to a compensated phase derivative modulation signal, and having a modulation control output coupled to the second variable capacitance.

The low-frequency-peaking compensation filter may operate on a digital signal having a first sampling rate, and the loop filter may operate on a digital signal having a second sampling rate, and the first sampling rate may be at least five times the second sampling rate. The first variable capacitance may be implemented as two separate variable capacitances to include a coarse-tuning variable capacitance and a fine-tuning variable capacitance. In some embodiments, the coarse-tuning capacitance is a varactor and the fine-tuning capacitance is a switched capacitor bank. Further, the coarse-tuning capacitance may be controlled by a channel selector, while the fine-tuning variable capacitance may be controlled by the PLL circuit including the loop filter. In some embodiments, the low-frequency-peaking compensation filter incorporates a channel-specific voltage-tuning constant (which, in some embodiments, includes some further FM processing as described above).

The compensated and differentiated phase signal is applied to the DCO 522 on modulation VCO control input 518. The output 524 of the DCO 522 is provided to the phase lock loop circuit, including a loop filter, and is depicted as a digital PLL (DPLL) circuit 530. The DPLL 530 generates a PLL control signal that corrects for low-frequency errors between a reference input and the output 524. The PLL control signal is applied to the PLL VCO control input 520.

The output 524 of the DCO 522 is also provided to an input of the DPA 528 to provide a constant envelope signal with the desired phase modulation. In some embodiments, an envelope signal 526 may be applied to control the magnitude of the signal output from amplifier 528. The amplifier 526 may therefore have a power control input configured to receive the envelope signal. The amplifier may take the form of a switching amplifier that includes an array of power FET devices that may be rapidly switched on and off to alter the output signal amplitude. In some embodiments AM processor 514 may provide additional pre-processing to account for distortions including non-linear response characteristics of the Digital Power Amp (DPA) 528.

Figure 6:
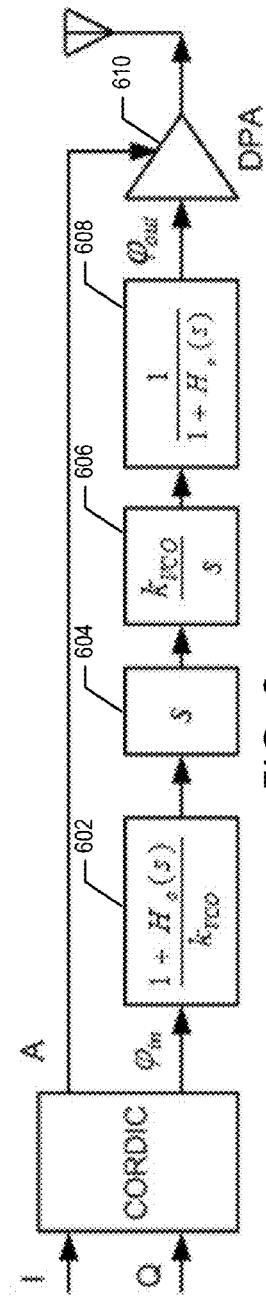
FIG. 6 is a linear model of a direct VCO modulation system using a digital compensation filter in accordance with some embodiments.

FIG. 6 depicts a linearized model of the circuit of FIG. 5 and is presented to further describe high-level aspects of the processing of the phase signal $\phi_{in}$ 508. The phase signal that represents the phase of a desired information-modulated transmit signal is processed by compensation filter 512 having a transfer function $$\frac{1+H_o(s)}{k_{VCO}}$$

represented by block 602.

The signal is then differentiated in block 604 as represented by transfer function s. The VCO itself acts as an integrator, and includes a VCO constant $k_{VCO}$ and is represented by block 606 having a transfer function $$\frac{k_{VCO}}{s}.$$

The phase locked loop provides a transfer function of $$\frac{1}{1+H_o(s)}$$

as shown in block 608, where $H_o(s)$ a low pass filter transfer function provided by the PLL loop, often referred to as the open loop transfer function. The carrier having the desired phase is applied to the amplifier DPA 610, and in some embodiments, the envelope signal "A" is also provided to DPA 610.

Figure 7A:
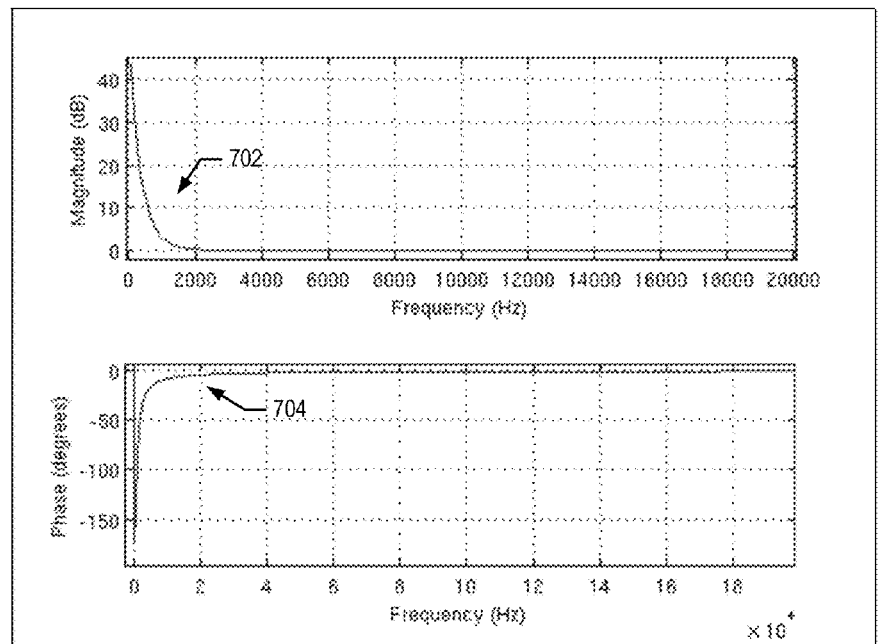
FIG. 7A is a plot of the magnitude and phase of a digital compensation filter in accordance with some embodiments.

With reference to FIG. 7A, the compensation filter response operates on the desired phase signal to increase its low frequency content. Note that the low frequency boost provided by the compensation filter $1+H_o(s)$ counteracts the high pass characteristic $1/(1+H_o(s))$ of the PLL loop transfer function. Thus, the compensation filter substantially cancels the VCO-output high-pass characteristic. The compensation filter mitigates the effect of the PLL circuit and loop filter by inverting, or approximating an inversion, of the PLL high pass characteristic. Note that if the PLL is a digital implementation, the high-pass characteristic will not vary significantly according to semiconductor process variations (so-called Process-Voltage-Temperature, or PVT variations). Similarly, the inverse filter may also be well-characterized, and not subject to significant PVT variations. Thus, in some embodiments, the PLL high pass characteristic may be pre-determined based on component design and selection. In further embodiments, the high-pass characteristic may be measured in a calibration procedure. The compensation filter may be based upon an estimate of the VCO-output high-pass characteristic.

Figure 7B:
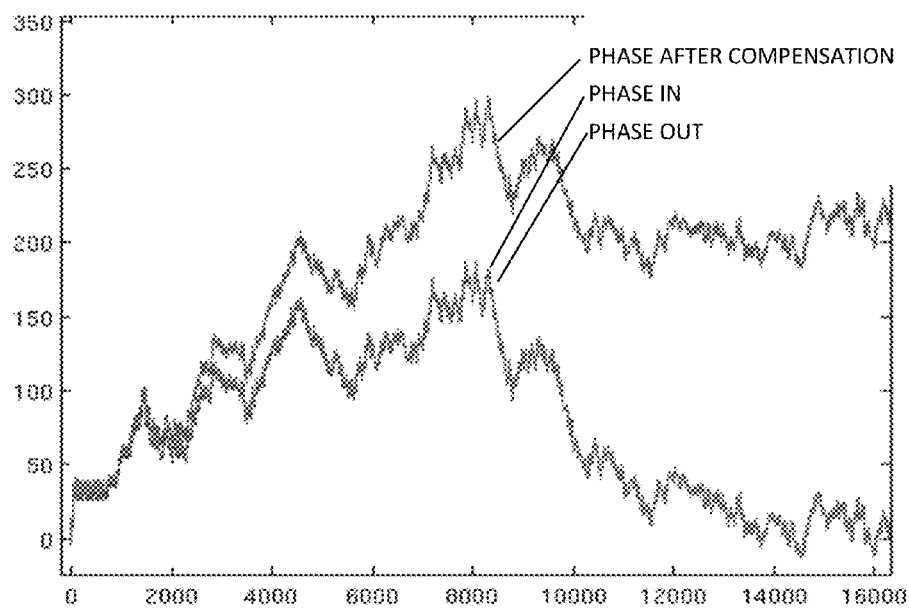
FIG. 7B is a plot of an example of a phase signal of a desired information-modulated transmit signal, a compensated phase signal, and an output phase signal representing the phase of the signal provided to an output amplifier in accordance with some embodiments.

In some embodiments, the compensation filter may also account for the VCO constant $k_{VCO}$. Note that the VCO may be modeled as having a separate $k_{VCO}$ for the PLL control input, and the PLL transfer function may also incorporate correction for this factor. The compensation filter may be a finite impulse response (FIR) or an infinite impulse response (IIR) digital filter. FIG. 7B depicts a sample waveform of the compensated phase signal as compared to the desired phase signal. The plot also shows the final phase (phase out) of the VCO output, which tracks very closely to the initial phase signal (phase in).

Figure 8:
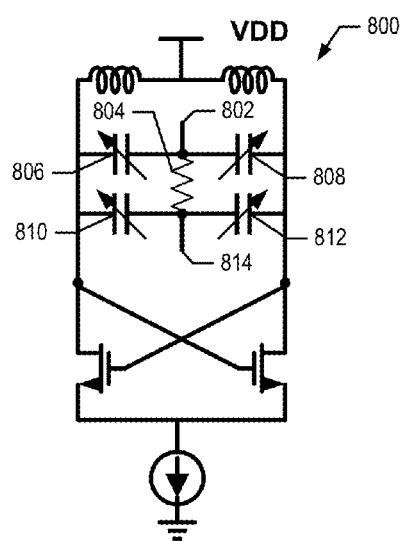
FIGS. 8-10 are circuit diagrams of a direct modulation VCO having two inputs for controlling two variable capacitances in accordance with some embodiments.
Figure 9:
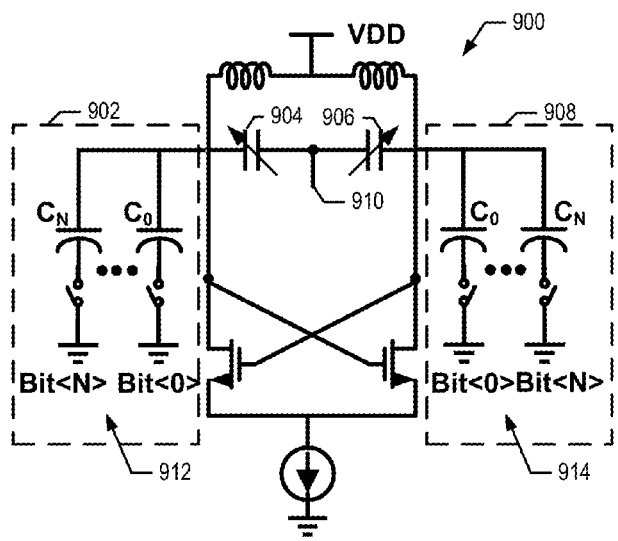
Figure 10:
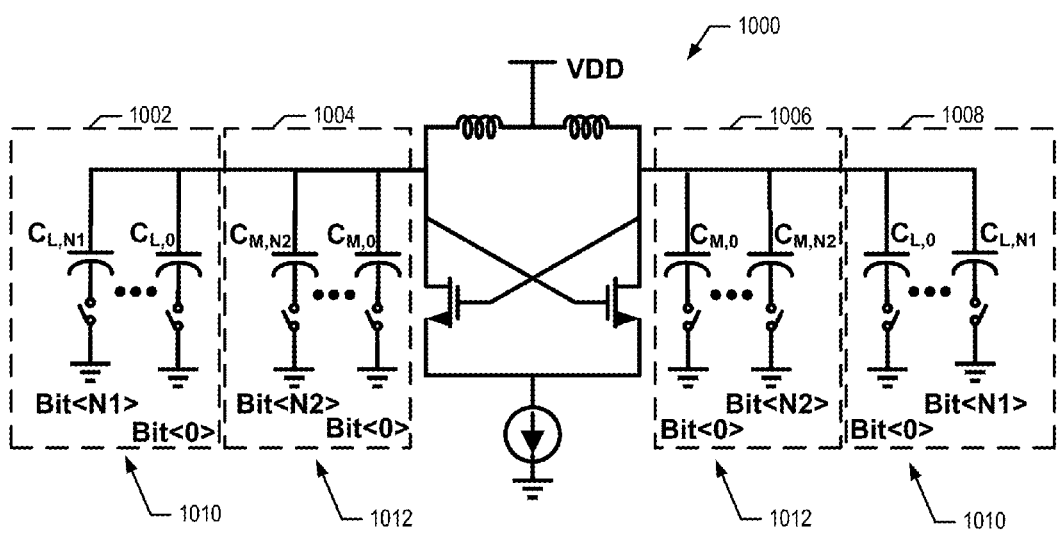

FIGS. 8-10 show various embodiments of DCO structures. With reference to FIG. 8, the DCO 800 includes a PLL VCO control input 802 having a variable capacitance provided by varactors 806, 808, and a modulation VCO control input 814 having a variable capacitance provided by varactors 810, 812. The two input nodes may be coupled via high impedance resistor 804. In this embodiment, the capacitance may be varied by adjusting an analog voltage of the input signals applied to the input nodes 802, 814. The capacitance, in turn, affects the frequency of oscillation.

With respect to FIG. 9, VCO 900 includes a PLL VCO control input 910 having a variable capacitance provided by varactors 904, 906, and a modulation VCO control input 912, 914, having a variable capacitance provided by switched capacitor banks 902, 908. In this embodiment, N+1 bits (Bit<N> to Bit<0>) are applied to the gates of transistors within capacitor banks 902, 908 to selectively place capacitors in the circuit 900 to alter the capacitance.

With respect tot FIG. 10, VCO 1000 includes a PLL VCO control input 1010 having a variable capacitance provided by switched capacitor banks 1002, 1008, and a modulation VCO control input 1012 having a variable capacitance provided by switched capacitor banks 1004, 1006. In this embodiment, N1+1 bits (Bit<N1> to Bit<0>) are applied to the gates of transistors within capacitor banks 1002, 1008 to selectively place capacitors in the circuit 1000 to alter the capacitance, and N2+1 bits (Bit<N2> to Bit<0>) are applied to the gates of transistors within capacitor banks 1004, 1006 to selectively place capacitors in the circuit 1000 to alter the capacitance.

Thus, in this embodiment, the PLL controller includes a digital filter, and the PLL control signal is a digital signal applied to a first set of switchable capacitors via the PLL VCO control input. The compensated phase derivative modulation signal is a digital signal applied to a second set of switchable capacitors via the modulation VCO control input.

In some embodiments, VCO comprises a first variable capacitance connected to the PLL VCO control input and a second variable capacitance connected to the modulation VCO control input, wherein either or both of the first variable capacitance and the second variable capacitance may take the form of voltage-tuned varactors or switched capacitor banks.

In further embodiments, the variable capacitance may be controlled by a combined signal formed an analog or digital combiner. The combiner may be configured to combine the PLL control signal and the compensated phase derivative modulation signal and to apply the combined control signal to a single variable capacitance. The single variable capacitance may be varactors or a switched capacitor bank.

Figure 11:
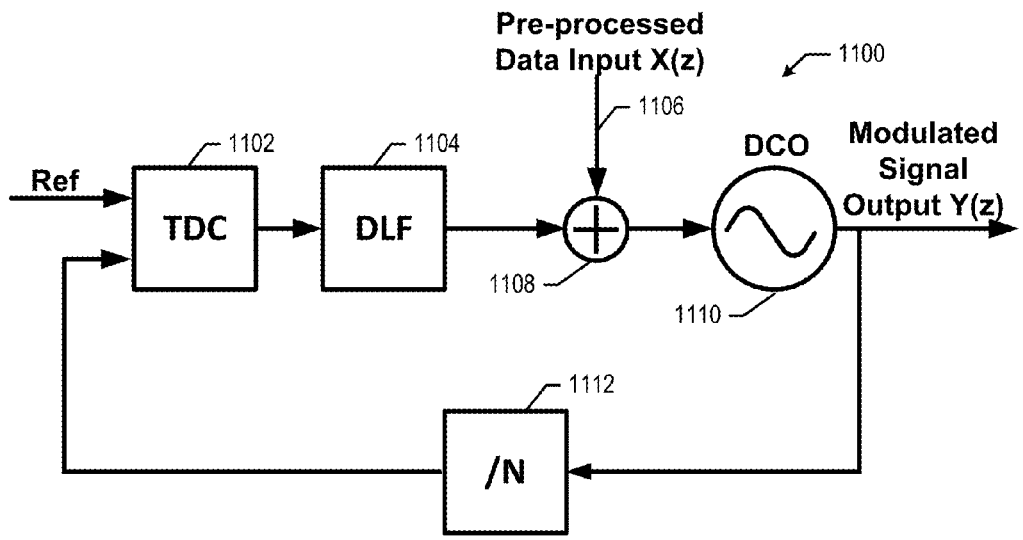
FIG. 11 is a block diagram of a direct modulation VCO having a digital loop filter in accordance with some embodiments.

In one embodiment shown in FIG. 11, the PLL controller includes a divider (÷N) 1112, a digital loop filter 1104, and a time-to-digital converter (TDC) 1102. The TDC may receive an accurate frequency reference input, such as from a crystal oscillator, and compare its phase to the phase of the output of the VCO and responsively generate an error signal. The TDC may be implemented as a phase detector such as a bang-bang phase detector. In the embodiment of FIG. 11, the PLL control signal is a digital signal and the compensated phase derivative modulation signal 1106 is a digital signal, and the combiner 1108 is a digital summer.

In some embodiments a digital-to-analog converter may be used to convert an output of the digital summer (or a digital PLL control signal or digital modulation control signal) to an analog control signal voltage and to apply the analog control signal to the variable capacitance.

Figure 12:
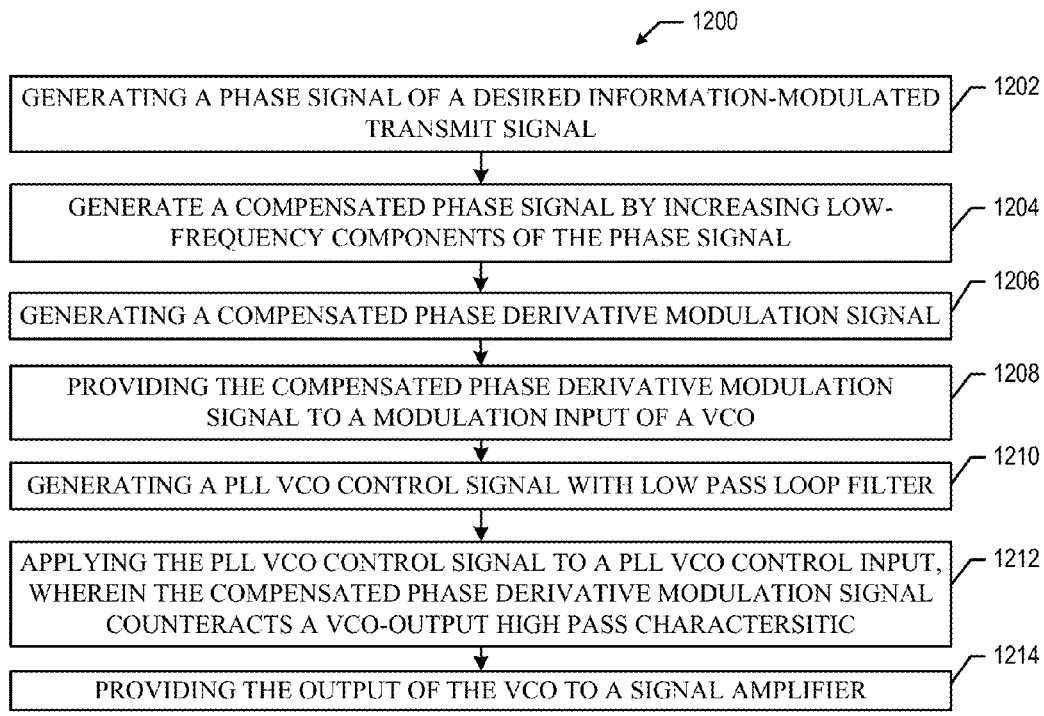
FIG. 12 is a flow diagram of a method in accordance with some embodiments.

In further embodiment shown in FIG. 12, a method 1200 comprises: at 1202, generating a phase signal of a desired information-modulated transmit signal; at 1204, compensation filtering the phase signal to generate a compensated phase signal by increasing low-frequency components of the phase signal to compensate for a VCO-output high-pass characteristic; at 1206, generating a compensated phase derivative modulation signal by converting the compensated phase signal to a compensated phase derivative modulation signal; at 1208, providing the compensated phase derivative modulation signal to a modulation input of a VCO; at 1210, generating a PLL VCO control signal using a low pass loop filter operating on a PLL error signal formed using an output of the VCO; at 1212 applying the PLL VCO control signal to a PLL VCO control input, wherein the PLL VCO control signal operates to provide the VCO-output high-pass characteristic by removing low-frequency variations from an output of the VCO, and wherein the compensated phase derivative modulation signal counteracts the VCO-output high pass characterstic; and, at 1214, providing the output of the VCO to a signal amplifier.

The method of claim 1200 may include providing the compensated phase derivative modulation signal to a variable capacitance. Further, providing the PLL VCO control signal to a PLL VCO control input may comprise providing the PLL VCO control signal to a variable capacitance.

The method 1200 may further comprise generating a combined control signal by combining the PLL control signal and the compensated phase derivative modulation signal and applying the combined control signal to a variable capacitance.

In further embodiments, the method 1200 may further comprise converting at least one of (i) the compensated phase derivative modulation signal, (ii) the PLL VCO control signal or (iii) a combined control signal from a digital signal to an analog control signal and applying the analog control signal to a variable capacitance.

The method 1200 may include generating a phase signal of a desired information-modulated transmit signal by processing an inphase baseband signal and a quadrature baseband signal. The method 1200 may further comprise generating an envelope signal of a desired information-modulated transmit signal; and, controlling an output signal amplitude of an amplifier applying the envelope signal to a power control input of the amplifier.

The system described herein may use a class-D (or inverse Class-D) DPA. Such amplifiers may obtain higher efficiency than class-A, class-B or class-AB power amplifiers, for example, approximately 35% efficiency at 14 dBm output levels. Furthermore, systems utilizing the DCO as modulator do not require an I/Q modulator, thereby providing large savings in system power consumption and circuitry real estate.

In addition, it should be noted that the desired phase signal might have significantly greater bandwidth than the I/Q baseband signal. In general, the nonlinear transformation from rectangular coordinates of baseband I/Q to polar coordinates of magnitude and phase may result in a phase signal having a bandwidth, for example, five times greater than the original I/Q baseband signal. Thus, a 10 MHz (single sideband) I/Q baseband information signal may generate a 50 MHz phase signal. In this regard, the baseband I/Q data samples may be interpolated (such as by a factor of 5) prior to polar conversion to provide the necessary sampling rate to capture the phase information. Consequently, the digital signal processing used to generate the phase signal of the desired information-modulated transmit signal, as well as the compensated phase derivative modulation signal, may operate at a relatively high sampling rate. Note, however, that the loop filter DPLL, and the time-to-digital-converter need not operate at such high rates. Because the data path for the direct VCO modulation is outside of the PLL, the signal processing of the data path is decoupled from the loop. That is, because the PLL is only processing information related to carrier generation/carrier lock and is not related to carrier modulation, the required PLL processing speed is no longer correlated with data rates. As such, the PLL may operate at much lower speeds, and its design and realization is itself simplified. Further, the carrier generation may be realized using a simple integer-N synthesizer.

With respect to implementations of an 802.11 Wi-Fi transmitter, a prior art two-point modulation system might require operations at a rate of at least 200 MHz, and perhaps as high as 800 MHz, to accommodate the desired modulation rate. For some of the embodiments described here, where the PLL is decoupled from data/signal transmission, the PLL processing may be as low as 20 MHz.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:
1. An apparatus comprising:
a phase locked loop (PLL) having a VCO-output high-pass characteristic, the PLL comprising:
a voltage controlled oscillator (VCO) having a PLL VCO control input and a modulation VCO control input; and,
a phase locked loop controller coupled to the PLL VCO control input and configured to output a PLL control signal to the PLL VCO control input;
a signal phase generator configured to generate a phase signal of a desired information-modulated transmit signal;
a compensation filter configured to generate a compensated phase signal by increasing low-frequency components of the phase signal to compensate for the VCO-output high-pass characteristic and the VCO gain characteristic;
a phase derivative generator having an input coupled to the compensation filter, the phase derivative generator configured to receive the compensated phase signal and to convert the compensated phase signal to a compensated phase derivative modulation signal, and having a modulation control output coupled to the modulation VCO control input for providing the compensated phase derivative modulation signal to the VCO.

2. The apparatus of claim 1 wherein the VCO comprises a first variable capacitance connected to the PLL VCO control input and a second variable capacitance connected to the modulation VCO control input.

3. The apparatus of claim 2 wherein the first variable capacitance and the second variable capacitance are selected from the group consisting of varactors and switched capacitor banks.

4. The apparatus of claim 1 wherein the VCO further comprises a variable capacitance and a combiner configured to combine the PLL control signal and the compensated phase derivative modulation signal and to apply the combined control signal to the variable capacitance.

5. The apparatus of claim 4 wherein the combiner is an analog voltage summer.

6. The apparatus of claim 4 wherein the PLL controller further comprises a digital filter, and wherein the PLL control signal is a digital signal and wherein the compensated phase derivative modulation signal is a digital signal, and the combiner is digital summer.

7. The apparatus of claim 6 wherein the variable capacitance is a switched capacitor bank.

8. The apparatus of claim 6 further comprising a digital-to-analog converter configured to convert an output of the digital summer to an analog control signal and to apply the analog control signal to the variable capacitance.

9. The apparatus of claim 1 wherein the PLL controller further comprises a digital filter, and wherein the PLL control signal is a digital signal applied to a first set of switchable capacitors via the PLL VCO control input and wherein the compensated phase derivative modulation signal is a digital signal applied to a second set of switchable capacitors via the modulation VCO control input.

10. The apparatus of claim 1 wherein the compensation filter substantially cancels the VCO-output high-pass characteristic.

11. The apparatus of claim 1 wherein the compensation filter is based upon an estimate of the VCO-output high-pass characteristic.

12. The apparatus of claim 1 wherein the signal phase generator is configured to process an inphase baseband signal and a quadrature baseband signal.

13. The apparatus of claim 12 wherein the signal phase generator is a rectangular-to-polar converter.

14. The apparatus of claim 12 wherein the signal phase generator is a CORDIC processor.

15. The apparatus of claim 1 further comprising:
a signal envelope generator configured to generate an envelope signal of a desired information-modulated transmit signal; and,
an amplifier having a signal input connected to an output of the VCO, and having a power control input configured to receive the envelope signal.

16. The apparatus of claim 15 wherein the envelope signal is digital and is first processed by a digital-to-analog converter before being provided to the amplifier.

17. The apparatus of claim 15 wherein the envelope signal is digital and is applied to a digital power amplifier having an array of power transistors.

18. A method comprising:
generating a phase signal of a desired information-modulated transmit signal;
compensation filtering the phase signal to generate a compensated phase signal by increasing low-frequency components of the phase signal to compensate for a VCO-output high-pass characteristic;
generating a compensated phase derivative modulation signal by converting the compensated phase signal to a compensated phase derivative modulation signal;
providing the compensated phase derivative modulation signal to a modulation input of a VCO;
generating a PLL VCO control signal using a low pass loop filter operating on a PLL error signal formed using an output of the VCO;
applying the PLL VCO control signal to a PLL VCO control input, wherein the PLL VCO control signal operates to provide the VCO-output high-pass characteristic by removing low-frequency variations from an output of the VCO, and wherein the compensated phase derivative modulation signal counteracts the VCO-output high pass characteristic; and,
providing the output of the VCO to a signal amplifier.

19. The method of claim 18 wherein providing the compensated phase derivative modulation signal to a modulation input of a VCO comprises providing the compensated phase derivative modulation signal to a variable capacitance.

20. The method of claim 18 wherein providing the PLL VCO control signal to a PLL VCO control input comprises providing the PLL VCO control signal to a variable capacitance.

21. The method of claim 18 further comprising generating a combined control signal by combining the PLL control signal and the compensated phase derivative modulation signal and applying the combined control signal to a variable capacitance.

22. The method of claim 18 further comprising converting at least one of (i) the compensated phase derivative modulation signal, (ii) the PLL VCO control signal or (iii) a combined control signal from a digital signal to an analog control signal and applying the analog control signal to a variable capacitance.

23. The method of claim 18 wherein generating a phase signal of a desired information-modulated transmit signal is performed by processing an inphase baseband signal and a quadrature baseband signal.

24. The method of claim 18 further comprising:
generating an envelope signal of a desired information-modulated transmit signal; and,
controlling an output signal amplitude of an amplifier applying the envelope signal to a power control input of the amplifier.

25. An apparatus comprising:
an oscillator having an oscillator output, a first variable capacitance, and a second variable capacitance;
a time-to-digital converter (TDC) connected to the oscillator output configured to generate a frequency error signal at an error output;
a loop filter connected to the TDC and configured to low-pass filter the frequency error output signal and to generate a loop VCO error signal at a loop filter output, the loop filter output connected to the first variable capacitance to reduce low-frequency carrier deviations at the oscillator output, including data-modulation-induced low-frequency variations;
a low-frequency-peaking compensation filter connected to the second variable capacitance, the low-frequency-peaking compensation filter configured to generate a compensated phase signal by increasing low-frequency components of a desired phase signal to compensate for the reduction of data-modulation-induced low-frequency carrier deviations;
a phase derivative generator having an input coupled to the low-frequency peaking compensation filter, the phase derivative generator configured to receive the compensated phase signal and to convert the compensated phase signal to a compensated phase derivative modulation signal, and having a modulation control output coupled to the second variable capacitance.

26. The apparatus of claim 25 wherein the low-frequency-peaking compensation filter operates on a digital signal having a first sampling rate, and the loop filter operates on a digital signal having a second sampling rate, and the first sampling rate is at least five times the second sampling rate.

27. The apparatus of claim 25 wherein the first variable capacitance includes a coarse-tuning variable capacitance and a fine-tuning variable capacitance.

28. The apparatus of claim 27 wherein the coarse-tuning capacitance is a varactor and the fine-tuning capacitance is a switched capacitor bank.

29. The apparatus of claim 27 wherein the coarse-tuning capacitance is controlled by a channel selector.

30. The apparatus of claim 25 wherein the low-frequency-peaking compensation filter incorporates a channel-specific voltage-tuning constant.

\* \* \* \* \*